(12) United States Patent
Takebayashi et al.

(10) Patent No.: US 10,279,700 B2
(45) Date of Patent: May 7, 2019

(54) BATTERY SYSTEM FOR VEHICLE AND CONTROL METHOD THEREOF

(71) Applicant: TOYOTA JIDOSHA KABUSHIKI KAISHA, Toyota-shi, Aichi-ken (JP)

(72) Inventors: Yoshitomo Takebayashi, Nisshin (JP); Nobukiyo Ito, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 23 days.

(21) Appl. No.: 15/794,691

(22) Filed: Oct. 26, 2017

(65) Prior Publication Data

US 2018/0134173 A1    May 17, 2018

(30) Foreign Application Priority Data

Nov. 16, 2016   (JP) ................. 2016-222903

(51) Int. Cl.
| | |
|---|---|
| G01R 31/36 | (2019.01) |
| H01M 10/44 | (2006.01) |
| H01M 10/052 | (2010.01) |
| B60L 11/18 | (2006.01) |
| B60L 11/12 | (2006.01) |
| B60L 11/14 | (2006.01) |

(52) U.S. Cl.
CPC ......... *B60L 11/1862* (2013.01); *B60L 11/12* (2013.01); *B60L 11/14* (2013.01); *G01R 31/36* (2013.01); *H01M 10/44* (2013.01); *H01M 10/446* (2013.01); *B60L 2240/54* (2013.01); *B60L 2240/545* (2013.01); *B60L 2240/547* (2013.01); *B60L 2240/549* (2013.01); *H01M 10/052* (2013.01); *H01M 2220/20* (2013.01); *Y02E 60/122* (2013.01)

(58) Field of Classification Search
CPC .................................... B60L 11/1862
USPC ........................................ 320/109
See application file for complete search history.

(56) References Cited

U.S. PATENT DOCUMENTS

| | | | | |
|---|---|---|---|---|
| 8,803,482 B2 * | 8/2014 | Ueki | ................. | H01M 10/0525 320/134 |
| 2013/0335034 A1 * | 12/2013 | Suzuki | ................. | H01M 4/525 320/160 |

(Continued)

FOREIGN PATENT DOCUMENTS

| | | |
|---|---|---|
| JP | 2015-106482 A | 6/2015 |
| JP | 2015-153509 A | 8/2015 |
| JP | 2016-143546 A | 8/2016 |

*Primary Examiner* — Suresh Memula
(74) *Attorney, Agent, or Firm* — Sughrue Mion, PLLC

(57) ABSTRACT

In a case where high-rate deterioration of a secondary battery progresses before execution of external charging by a charging device, an electronic control unit (ECU) executes an SOC adjustment process of adjusting an SOC of the secondary battery such that the SOC falls within a predetermined range. The predetermined range is a range where an expansion-contraction change of a negative electrode of the secondary battery along with charge and discharge of the secondary battery is small as compared with a case where the SOC is out of the predetermined range. After the execution of the SOC adjustment process, the ECU executes a process of moderating the high-rate deterioration so as to moderate the high-rate deterioration, and then executes the external charging.

5 Claims, 11 Drawing Sheets

(56) References Cited

U.S. PATENT DOCUMENTS

2016/0126764 A1* 5/2016 Lim .................. H02J 7/0013
320/112
2016/0254562 A1* 9/2016 Morris-Cohen ...... H01M 8/188
320/128

* cited by examiner

BATTERY SYSTEM FOR VEHICLE AND CONTROL METHOD THEREOF

CROSS-REFERENCE TO RELATED APPLICATIONS

This application claims priority to Japanese Patent Application No. 2016-222903 filed on Nov. 16, 2016, which is incorporated herein by reference in its entirety.

BACKGROUND

1. Technical Field

The present disclosure relates to a battery system for a vehicle and a control method thereof, and particularly, to a battery system including a secondary battery rechargeable by a power supply provided outside a vehicle and a control method thereof.

2. Description of Related Art

There has been known a fact that charge and discharge of a secondary battery causes a deviation (hereinafter also referred to as a "salt concentration unevenness") in a salt concentration distribution in the secondary battery, which results in an increase in an internal resistance of the secondary battery and a decrease in input-output performance of the secondary battery. The salt concentration unevenness occurs due to discharge or charge with heavy current, and the decrease in the input-output performance of the secondary battery due to the salt concentration unevenness is also called "high rate deterioration," distinguished from aged deterioration. As the salt concentration unevenness, there are a salt concentration unevenness caused by high-rate discharge (over-discharge) and a salt concentration unevenness caused by high-rate charge (overcharge) (a salt concentration unevenness in a reverse direction to the salt concentration unevenness caused by over-discharge).

Japanese Patent Application Publication No. 2015-106482 (JP 2015-106482 A) discloses a charging system that can charge an in-vehicle secondary battery by a power supply (hereinafter also referred to as an "external power supply") provided outside a vehicle (hereinafter, charging of the in-vehicle secondary battery by the external power supply is also referred to as "external charging"). In the charging system, when high-rate deterioration is caused by over-discharge, the high-rate deterioration is moderated (re-covered) by execution of quick charging (external charging) (see JP 2015-106482 A).

SUMMARY

In the charging system described in JP 2015-106482 A, when high-rate deterioration is caused by over-discharge, external charging in which a charging current in a reverse direction to an over-discharge current that has caused a salt concentration unevenness is applied is executed, such that the high-rate deterioration is moderated. However, depending on the situation, even if the current in the reverse direction to the current that has caused the salt concentration unevenness flows through the secondary battery, the high-rate deterioration may further progress.

The present disclosure is accomplished in view of the above problems, and is to provide a battery system for a vehicle, which can restrain progression of high-rate deterioration of a secondary battery by execution of external charging, and a control method thereof.

In view of this, one aspect of the present disclosure provides a battery system for a vehicle, the battery system including a secondary battery, a charging device, and an electronic control unit. The secondary battery is provided in the vehicle. The charging device is configured to charge the secondary battery by a power supply provided outside the vehicle. The electronic control unit is configured as below. That is, the electronic control unit is configured to (i) control charge and discharge of the secondary battery; (ii) execute a state of charge adjustment process of adjusting a State of Charge of the secondary battery such that the state of charge falls within a predetermined range, the state of charge adjustment process being executed when deterioration (high-rate deterioration) of the secondary battery progresses before the secondary battery is charged by the charging device, the high-rate deterioration being deterioration of the secondary battery in which an internal resistance of the secondary battery increases along with a salt concentration unevenness in the secondary battery due to the charge and discharge of the secondary battery, the predetermined range being a range where an expansion-contraction change of a negative electrode of the secondary battery along with the charge and discharge of the secondary battery is small as compared with a case where the state of charge is out of the predetermined range; (iii) execute a first process of controlling the charge and discharge of the secondary battery, after executing the state of charge adjustment process, such that either one of an over-discharge current, an absolute value of which is larger than a first threshold, and an overcharge current, an absolute value of which is larger than a second threshold, flows through the secondary battery; (iv) execute a second process of controlling the charge and discharge of the secondary battery such that a different one of the over-discharge current and the overcharge current from the first process flows through the secondary battery, when the high-rate deterioration further progresses due to the execution of the first process; (v) execute a third process of controlling the charge and discharge of the secondary battery such that the same current as the one flowing in the first process, out of the over-discharge current and the overcharge current, flows through the secondary battery, when the high-rate deterioration further progresses due to the execution of the first process; and (vi) charge the secondary battery by the charging device after the execution of the second or third process.

Further another aspect of the present disclosure provides a control method of a battery system for a vehicle. The battery system includes a secondary battery provided in the vehicle, and a charging device configured to charge the secondary battery by a power supply provided outside the vehicle. The control method is a method for controlling the battery system as follows. (i) A state of charge adjustment process of adjusting a state of charge of the secondary battery is executed such that the state of charge falls within a predetermined range, the state of charge adjustment process being executed when deterioration (high-rate deterioration) of the secondary battery progresses, before the secondary battery is charged by the charging device, the high-rate deterioration of the secondary battery being deterioration in which an internal resistance of the secondary battery increases along with a salt concentration unevenness in the secondary battery due to charge and discharge of the secondary battery, the predetermined range being a range where an expansion-contraction change of a negative electrode of the secondary battery along with the charge and discharge of the secondary battery is small as compared with a case where the state of charge is out of the predetermined range. (ii) A first process of controlling the charge and discharge of the secondary battery is executed after the execution of the state of charge adjustment process, such that either one of an over-discharge current, an absolute value of which is larger than a first threshold, and an overcharge current, an absolute value of which is larger than a second threshold, flows through the secondary battery. (iii) When the high-rate deterioration further progresses due to the execution of the first process, a second process of controlling the charge and discharge of the secondary battery is executed such that a different one of the over-discharge current and the overcharge current from the first process flows through the secondary battery. (iv) When the high-rate deterioration is moderated by the execution of the first process, a third process of controlling the charge and discharge of the secondary battery is executed such that the same current as the one flowing in the first process, out of the over-discharge current and the overcharge current, flows through the secondary battery. (v) The secondary battery is charged by the charging device after the execution of the second or third process.

In the battery system for the vehicle and the control method thereof, depending on whether the high-rate deterioration further progresses or is moderated by the execution of the first process, it is checked whether the high-rate deterioration is caused by over-discharge or overcharge. When the high-rate deterioration further progresses due to the execution of the first process, the second process is executed, and when the high-rate deterioration is moderated due to the execution of the first process, the third process is executed, such that the high-rate deterioration is moderated and then the external charging is executed.

Here, depending on the state of charge of the secondary battery, even if a current in a reverse direction to a current (an over-discharge current or an overcharge current) that has caused a salt concentration unevenness is applied to the secondary battery, the high-rate deterioration might further progress. More specifically, the negative electrode of the secondary battery expands and contracts along with charge and discharge of the secondary battery. In terms of this, the expansion and contraction of the negative electrode along with the charge and discharge varies depending on the state of charge, and in a state of charge region where an expansion-contraction change is large, such a phenomenon occurs that electrolytic solution is pushed out from the negative electrode due to the expansion and contraction of the negative electrode along with the charge and discharge of the secondary battery. As a result, in such a state of charge region, even if the current in the reverse direction to the current that has caused the salt concentration unevenness is applied to the secondary battery, the salt concentration unevenness might further increase, which further promotes the high-rate deterioration.

In view of this, in the battery system and the control method thereof in the present disclosure, the first process and the second or third process in accordance with a result of the first process are executed after the state of charge is adjusted such that the state of charge falls within a predetermined range where an expansion-contraction change of the negative electrode along with charge and discharge of the secondary battery is small. Hereby, it is possible to check whether the high-rate deterioration is caused by over-discharge or by overcharge by the execution of the first process, and the high-rate deterioration is surely moderated by the second or third process based on the check result. Accordingly, with the battery system, it is possible to execute external charging after the high-rate deterioration is moderated, and as a result, it is possible to restrain progression of the high-rate deterioration due to the execution of the external charging, in comparison with a state before the execution of the external charging.

Further, in the battery system for the vehicle, the electronic control unit may be configured as follows. That is, (i) when the internal resistance of the secondary battery is increased by the execution of the first process, the electronic control unit executes the second process based on the determination that the deterioration further progresses by the execution of the first process. (ii) When the internal resistance of the secondary battery is decreased by the execution of the first process, the electronic control unit executes the third process based on the determination that the deterioration is moderated by the execution of the first process, and the electronic control unit executes the third process.

With the battery system, it is possible to easily determine a change tendency of the high-rate deterioration (further progression or moderation) based on a change tendency (an increase or a decrease) of the internal resistance of the secondary battery by the execution of the first process.

Further, in the battery system, a lower limit of the predetermined range may be a state of charge of 40 percentage or more, and an upper limit of the predetermined range may be a state of charge of 70 percentage or less.

In the battery system, the first process and the second or third process based on a result of the first process are executed after the state of charge is adjusted such that the state of charge falls within a range of the state of charge from 40 percentage to 70 percentage where the expansion-contraction change of the negative electrode along with the charge and discharge of the secondary battery is small. Accordingly, the high-rate deterioration can be surely moderated by the second or third process based on the result of the first process.

Further, in the battery system, (i) the over-discharge current may include at least one set of a current pattern constituted by a first discharging current pulse and a first charging current pulse having the same quantity of electricity; (ii) the overcharge current may include at least one set of a current pattern constituted by a second charging current pulse and a second discharging current pulse having the same quantity of electricity; and (iii) an absolute value of the first discharging current pulse may be larger than the first threshold, an absolute value of the first charging current pulse may be smaller than the second threshold, an absolute value of the second charging current pulse may be larger than the second threshold, and an absolute value of the second discharging current pulse may be smaller than the first threshold.

Since the first discharging current pulse and the first charging current pulse have the same quantity of electricity, the over-discharge current is applied to the secondary battery so as to change a degree of the high-rate deterioration, but the state of charge does not change in total. Similarly, since the second charging current pulse and the second discharging current pulse have the same quantity of electricity, the overcharge current is applied to the secondary battery so as to change a degree of the high-rate deterioration, but the state of charge does not change in total. Accordingly, with the battery system, even if each of the first to third processes is executed, the state of charge is maintained within the predetermined range, which allows the first process and the second or third process based on the result of the first process to be effective.

With the battery system for the vehicle and the control method thereof in the present disclosure, it is possible to execute the external charging after the high-rate deterioration is moderated. As a result, it is possible to restrain progression of the high-rate deterioration due to the execution of the external charging, in comparison with a state before the execution of the external charging.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
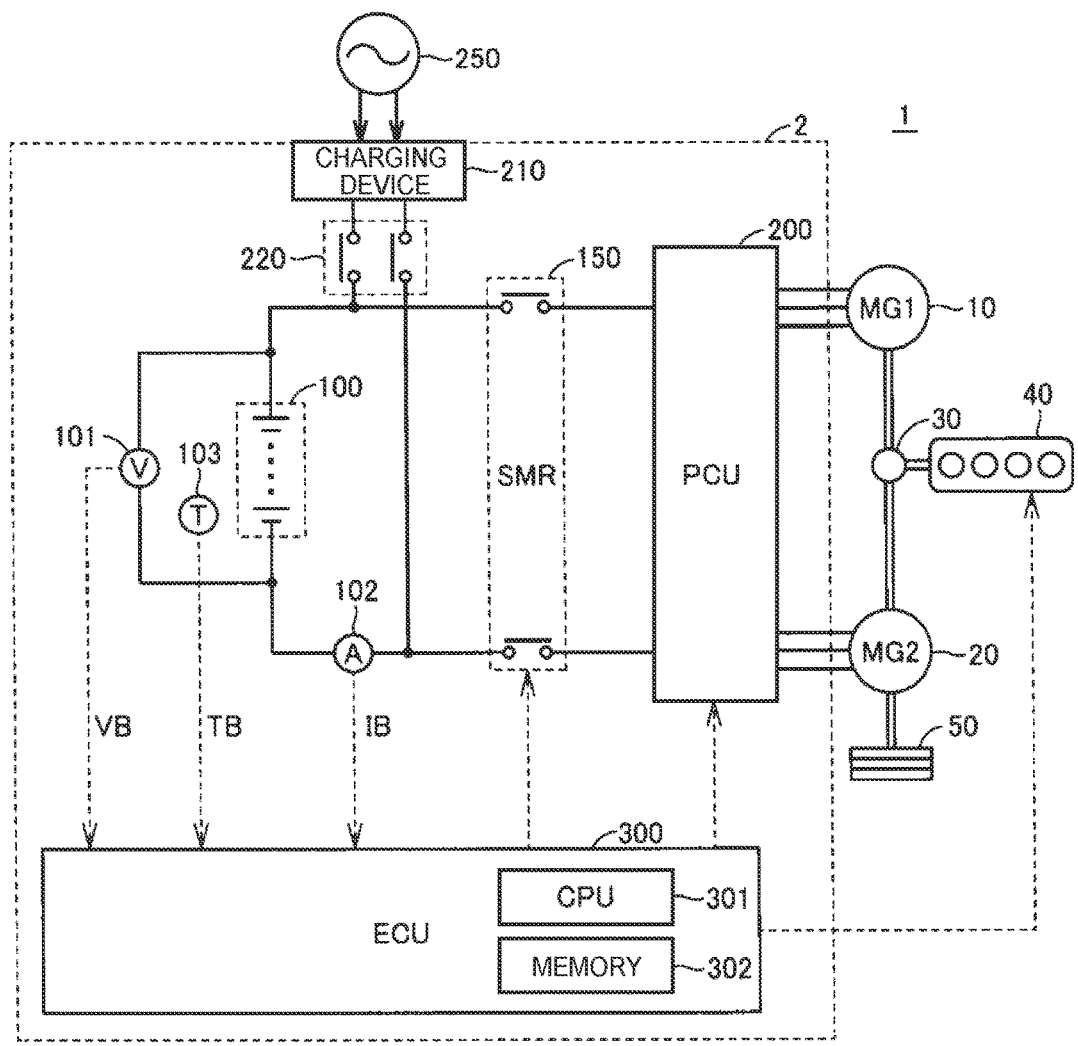
FIG. 1 is a schematic configuration diagram of a battery system for a vehicle according to an embodiment of the present disclosure.

The following describes an embodiment of the present disclosure in detail with reference to the drawings. Note that the same or equivalent portions in the drawings have the same reference sign and descriptions thereof are not repeated.

FIG. 1 is a schematic configuration diagram of a battery system for a vehicle according to the embodiment of the present disclosure. With reference to FIG. 1, a vehicle 1 includes a battery system 2, a first motor generator (hereinafter referred to as the "first MG") 10, a second motor generator (hereinafter referred to as the "second MG") 20, a power distribution device 30, an engine 40, and driving wheels 50. The battery system 2 includes a secondary battery 100, a system main relay (hereinafter referred to as the SMR (System Main Relay)") 150, a power control unit (hereinafter referred to as the PCU (Power Control Unit)") 200, a charging device 210, a charging relay 220, and an electronic control unit (hereinafter referred to as the "ECU (Electronic Control Unit) 300.

The vehicle 1 is a hybrid vehicle running by at least one of a power of the engine 40 and a power of the second MG 20. Note that the present disclosure typically deals with a case where the vehicle 1 is a hybrid vehicle, but a vehicle to which the present disclosure is applicable is not limited to such a hybrid vehicle, but should be a vehicle including the battery system 2.

The first MG 10 and the second MG 20 are alternating current motors, e.g., three-phase alternating synchronous motors in which permanent magnets are embedded in a rotor. The first MG 10 is mainly used as a generator driven by the engine 40 via the power distribution device 30. An electric power generated by the first MG 10 is supplied to the second MG 20 or the secondary battery 100 via the PCU 200.

The second MG 20 mainly works as an electric motor so as to drive the driving wheels 50. The second MG 20 receives at least one of an electric power from the secondary battery 100 and the electric power generated by the first MG 10, and a driving force of the second MG 20 is transmitted to the driving wheels 50. In the meantime, at the time of braking of the vehicle 1 or a reduction of acceleration in a downhill slope, the second MG 20 works as a generator to perform regenerative power generation. An electric power generated by the second MG 20 is recovered by the secondary battery 100 via the PCU 200.

The engine 40 is an internal combustion engine that outputs a power by converting a combustion energy generated at the time of burning a fuel-air mixture of air and fuel into a kinetic energy of a motion element such as a piston or a rotor. The power distribution device 30 includes a planetary gear mechanism having three rotating shafts, i.e., a sun gear, a carrier, and a ring gear, for example. The power distribution device 30 divides the power output from the engine 40 into a power for driving the first MG 10 and a power for driving the driving wheels 50.

The PCU 200 converts a direct-current power received from the secondary battery 100 into an alternating-current power to drive the first MG 10 and the second MG 20. Further, the PCU 200 converts an alternating-current power generated by the first MG 10 and the second MG 20 into a direct-current power to charge the secondary battery 100. The PCU 200 is constituted, for example, by two inverters provided for the first MG 10 and the second MG 20, and a converter for boosting a DC voltage to be supplied to each inverter to at least a voltage of the secondary battery 100.

The secondary battery 100 is constituted by an assembled battery including a plurality of single cells electrically connected in series to each other. Each single cell is constituted by a non-aqueous secondary battery represented by a lithium-ion single cell. Note that some of the plurality of single cells may be connected in parallel to each other.

The secondary battery 100 is provided with a voltage sensor 101, a current sensor 102, and a temperature sensor 103. The voltage sensor 101 detects a voltage VB of the secondary battery 100 and outputs its detection value to the ECU 300. The current sensor 102 detects a current IB input-output with respect to the secondary battery 100 and outputs its detection value to the ECU 300. The temperature sensor 103 detects a temperature TB of the secondary battery 100 and outputs its detection value to the ECU 300.

Note that the voltage sensor 101 may detect voltages of the plurality of single cells constituting the secondary battery 100 and may divide the plurality of single cells into a plurality of blocks so as to detect respective voltages of the blocks. Further, in the following description, in terms of the current IB detected by the current sensor 102, a discharging current is expressed as a positive value and a charging current is expressed as a negative value. Further, the number of temperature sensors 103 can be set appropriately. When a plurality of temperature sensors 103 is used, an average value of temperatures detected by the plurality of temperature sensors 103 can be used as the temperature of the secondary battery 100 or a temperature detected by a specific temperature sensor 103 can be used as the temperature of the secondary battery 100.

The charging device 210 converts an electric power supplied from the external power supply 250 into a voltage level of the secondary battery 100 and supplies it to the secondary battery 100. The charging device 210 is connected to the secondary battery 100 via the charging relay 220. When the charging relay 220 is turned on, the electric power from the external power supply 250 can be supplied to the secondary battery 100.

The external power supply 250 is a power supply provided outside the vehicle 1, and is a commercial AC power supply, for example. The external power supply 250 and the charging device 210 are connectable to each other via a charger cable (not shown). That is, when a connector of the charger cable is attached to an inlet (not shown) of the charging device 210, the external power supply 250 and the charging device 210 are electrically connected to each other via the charger cable.

Alternatively, the charging device 210 may be configured such that an electric power is transmitted in a contactless manner between the external power supply 250 and the charging device 210. For example, an electric power is transmitted in a contactless manner through a magnetic field between a power transmission coil (not shown) provided in the external power supply 250 and a power receiving coil (not shown) provided in the charging device 210, such that the electric power can be transmitted from the external power supply 250 to the charging device 210 in a contactless manner.

In a case where an alternating-current power is supplied from the external power supply 250, the charging device 210 is configured to have a function to convert a supply power (the alternating-current power) from the external power supply 250 into a charging electric power (a direct-current power) of the secondary battery 100. Alternatively, in a case where the external power supply 250 directly supplies the charging electric power of the secondary battery 100, the charging device 210 just supplies the direct-current power from the external power supply 250 to the secondary battery 100. As described above, the vehicle 1 is configured such that the secondary battery 100 is externally chargeable, but a type of the external charging is not limited in particular.

The ECU 300 includes a CPU (Central Processing Unit) 301, a memory 302 that stores processing programs, data, and the like therein, input-output ports (not shown) for inputting and outputting various signals, and so on, and controls operations of the SMR 150, the PCU 200, the engine 40, the charging device 210, the charging relay 220, and so on. As a main control executed by the ECU 300, the ECU 300 controls charge and discharge of the secondary battery 100. Further, the ECU 300 controls the charging device 210 so as to execute external charging of the secondary battery 100. The main control executed by the ECU 300 will be described later in detail.

Note that, in the present embodiment, the ECU 300 includes the memory 302 therein, but the memory 302 can be provided outside the ECU 300. Various controls executed by the ECU 300 are not limited to processes executed by software, but can be processed by exclusive hardware (an electronic circuit).

Figure 2:
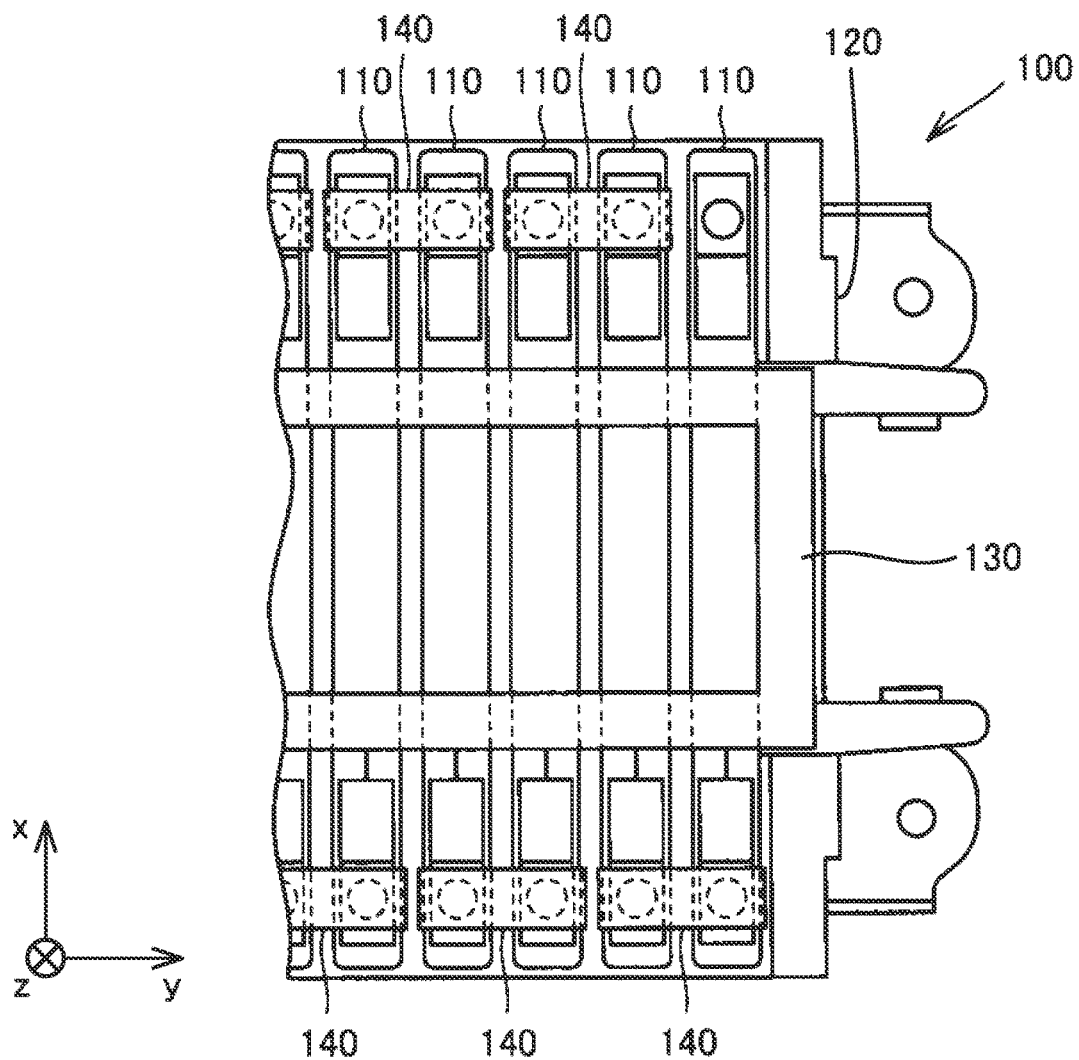
FIG. 2 is a view more specifically illustrating a configuration of a secondary battery provided in the battery system illustrated in FIG. 1.

FIG. 2 is a view more specifically illustrating a configuration of the secondary battery 100. With reference to FIG. 2, the secondary battery 100 includes the plurality of single cells 110, a pair of end plates 120, a restraining band 130, and a plurality of bus bars 140.

Each of the plurality of single cells 110 has a generally rectangular solid shape, for example. The plurality of single cells 110 is laminated such that side surfaces (surfaces parallel to an xz plane in the figure) having a largest area are opposed to each other with a distance therebetween. In FIG. 2, one end, in a laminating direction (a y-direction), of a laminated body formed by laminating the plurality of single cells 110 is partially illustrated. A pair of end plates 120 (only one of them is illustrated in FIG. 2.) are placed so as to be opposed to one end and the other end of the laminated body in the laminating direction. The restraining band 130 restricts the pair of end plates 120 that sandwich all the single cells 110 therebetween.

Figure 3:
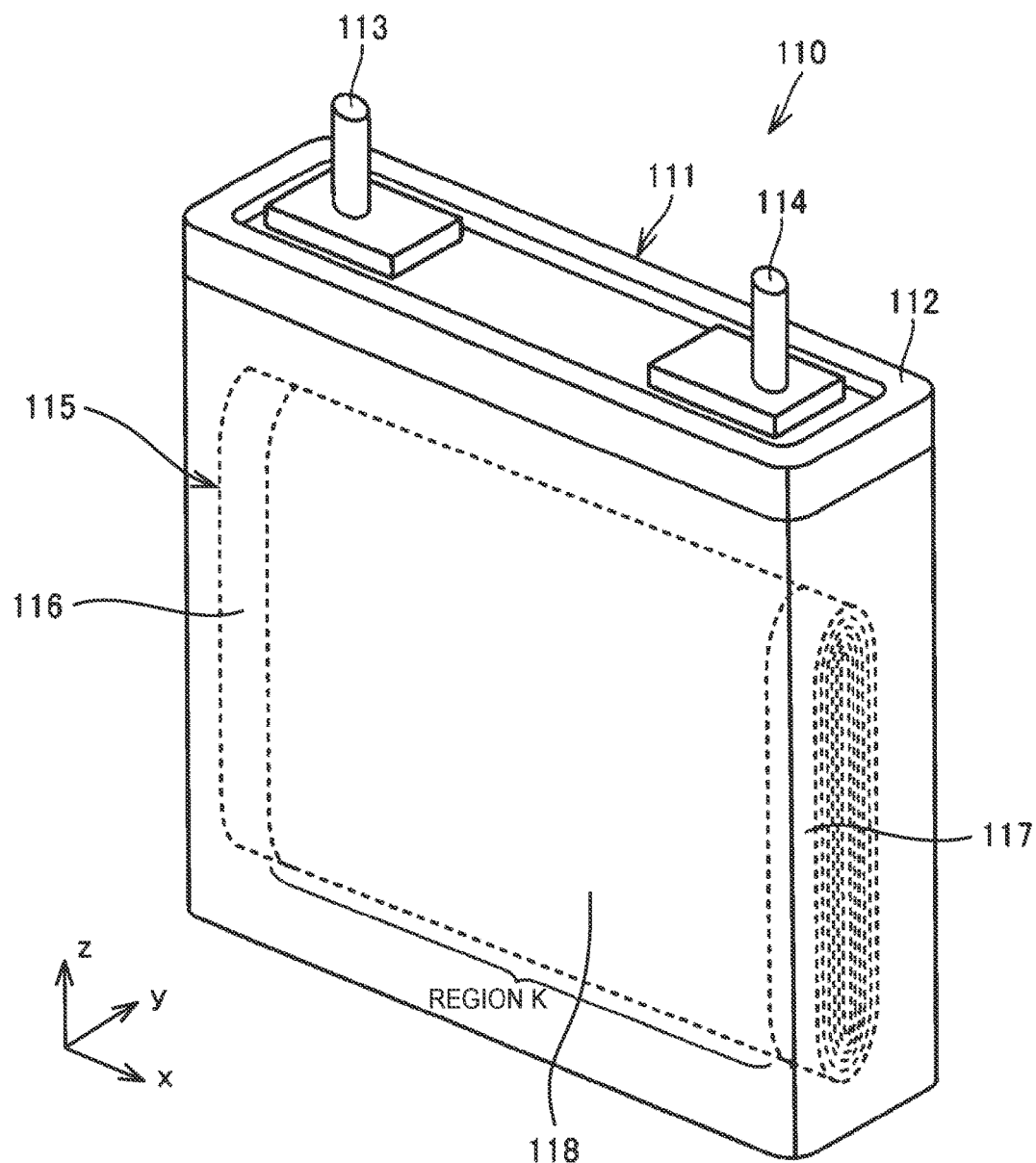
FIG. 3 is a view more specifically illustrating a configuration of a single cell included in the secondary battery.

FIG. 3 is a view more specifically illustrating a configuration of the single cell 110. With reference to FIG. 3, a top surface (an upper surface in a z-axis direction) of a case 111 of the single cell 110 is sealed by a lid 112. The lid 112 is provided with a positive terminal 113 and a negative terminal 114. Respective one ends of the positive terminal 113 and the negative terminal 114 project outside the lid 112. A positive terminal 113 of a given single cell and a negative terminal 114 of its adjacent single cell are placed so as to be opposed to each other and the terminals are fastened by a bus bar 140 so as to be electrically connected to each other (FIG. 2). Hereby, the plurality of single cells 110 is connected in series to each other inside the secondary battery 100. The other ends of the positive terminal 113 and the negative terminal 114 are electrically connected to an inner positive terminal and an inner negative terminal (not shown), respectively, inside the case 111.

An electrode body 115 is accommodated inside the case 111 (the electrode body 115 is indicated by a broken line through the case 111). The electrode body 115 is formed such that a positive-electrode sheet 116 and a negative-electrode sheet 117 laminated via a separator 118 are wound cylindrically around an x axis.

Figure 4:
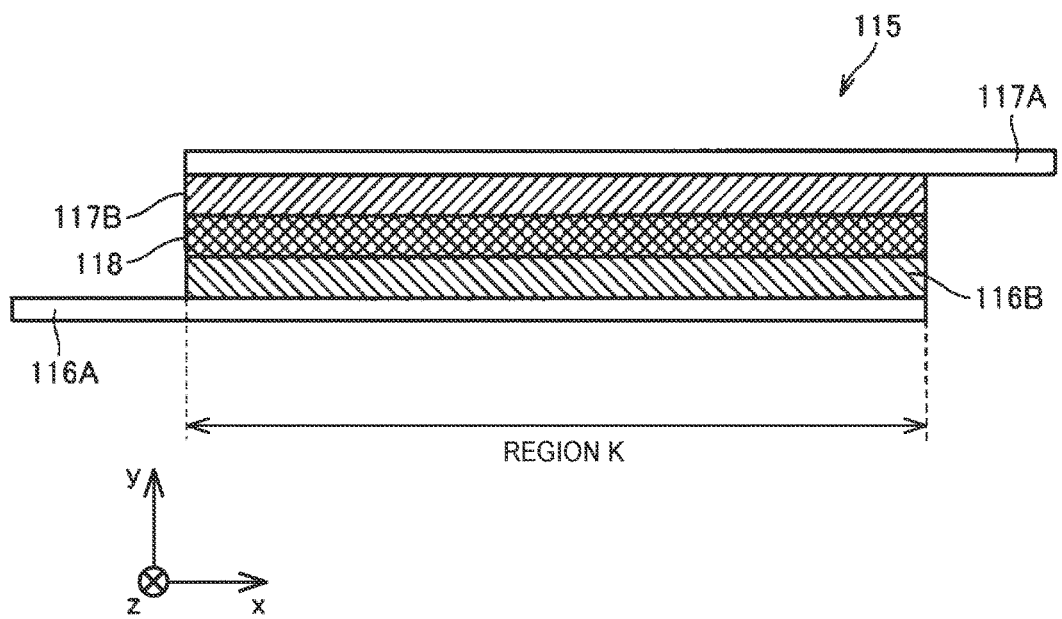
FIG. 4 is a view more specifically illustrating a configuration of an electrode body accommodated in the single cell.

FIG. 4 is a view more specifically illustrating a configuration of the electrode body 115. In FIG. 4, an x-direction is an in-plane direction of each layer, and a y-direction is a laminating direction of the layers. With reference to FIG. 4, the positive-electrode sheet 116 includes a current collector foil 116A, and a positive-electrode active material layer 116B formed on a surface of the current collector foil 116A (a layer including a positive-electrode active material, a conductive material, and a binder). Similarly, the negative-electrode sheet 117 includes a current collector foil 117A, and a negative-electrode active material layer 117B formed on a surface of the current collector foil 117A (a layer including a negative-electrode active material, a conductive material, and a binder). The separator 118 is provided so as to make contact with both the positive-electrode active material layer 116B and the negative-electrode active material layer 117B. A region where the positive-electrode active material layer 116B and the negative-electrode active material layer 117B are opposed to each other via the separator 118 is indicated by "K." The positive-electrode active material layer 116B, the negative-electrode active material layer 117B, and the separator 118 are impregnated with electrolytic solution.

As materials for the positive-electrode sheet 116, the negative-electrode sheet 117, the separator 118, and the electrolytic solution, well-known various materials can be used. As one example, lithium cobalt oxide or lithium manganese oxide is used for the positive-electrode sheet 116. Carbon is used for the negative-electrode sheet 117. Polyolefin is used for the separator 118. The electrolytic solution contains an organic solvent, lithium ions, and an additive. Note that it is not necessary to form the electrode body 115 as a wound body, and the electrode body 115 may be a laminated body, which is not wound.

In the battery system 2 configured as above, when discharging or charging is performed at a high rate as described above, a salt concentration unevenness occurs inside the secondary battery 100, which results in an increase in an internal resistance of the secondary battery 100 and a decrease in input-output performance of the secondary battery 100 (high-rate deterioration). The salt concentration unevenness might occur both in the in-plane direction (the x-direction) and the laminating direction (the y-direction) of the electrode body 115, but generally, a deviation in the in-plane direction is more remarkable than a deviation in the laminating direction. In view of this, the following describes a salt concentration unevenness in the in-plane direction.

Note that, in the following description, a state where a salt concentration unevenness is caused due to intermittent high-rate discharge (over-discharge) may be referred to as "an over-discharge state," and a state where a salt concentration unevenness is caused due to intermittent high-rate charge (overcharge) may be referred to as "an overcharge state." Further, a high-rate discharging current that causes the over-discharge state may be referred to as an "over-discharge current," and a high-rate charging current that causes the overcharge state may be referred to as an "overcharge current."

Figure 5:
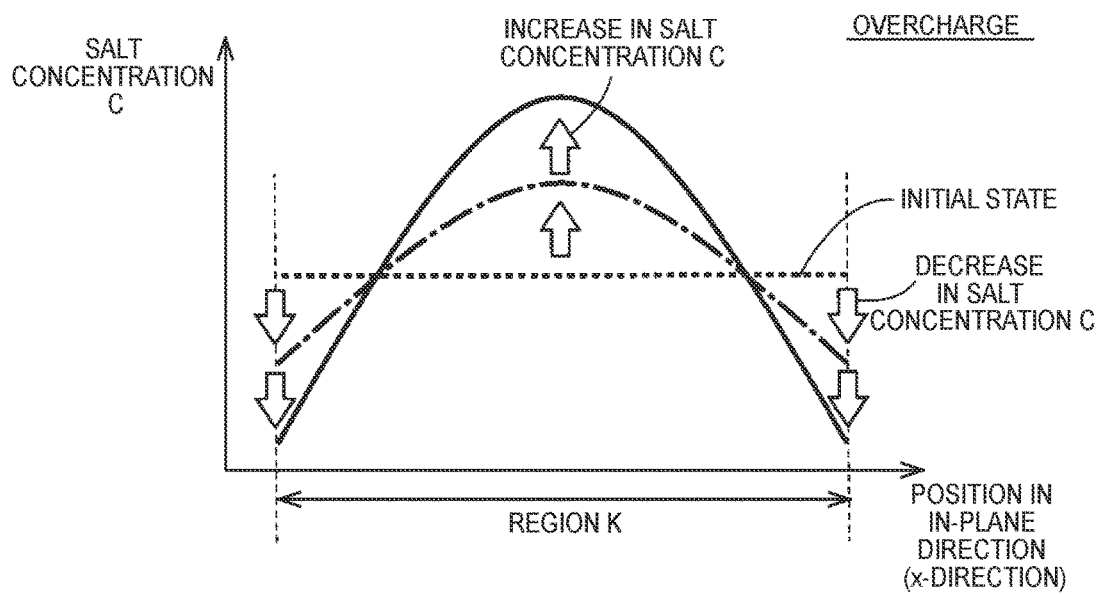
FIG. 5 is a view illustrating a salt concentration unevenness in an in-plane direction of the electrode body at the time when the secondary battery is in an overcharge state.
Figure 6:
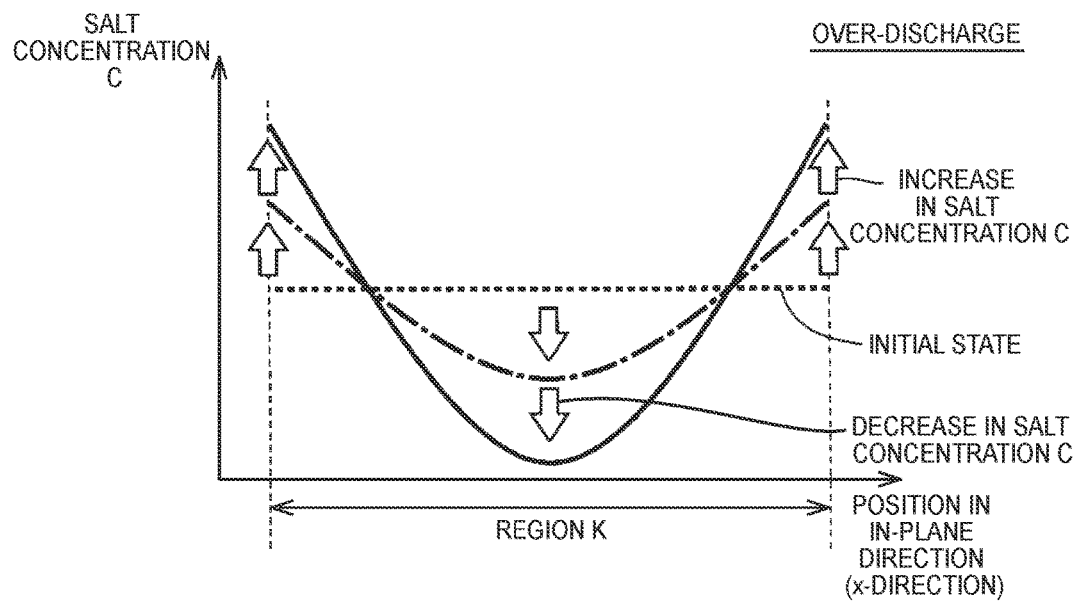
FIG. 6 is a view illustrating a salt concentration unevenness in the in-plane direction of the electrode body at the time when the secondary battery is in an over-discharge state.

FIG. 5 is a view illustrating a salt concentration unevenness in the in-plane direction of the electrode body 115 in the overcharge state. In the meantime, FIG. 6 is a view illustrating a salt concentration unevenness in the in-plane direction of the electrode body 115 in the over-discharge state. In FIGS. 5, 6, a horizontal axis indicates a position in the in-plane direction (the x-direction) of the electrode body 115, and a vertical axis indicates a salt concentration C.

With reference to FIG. 5, in an initial state (e.g., a state just after the manufacture) of the single cell 110, the salt concentration C is generally uniform. When an overcharge current intermittently flows in the single cell 110, a salt concentration C near a center of the region K increases, but salt concentrations C near both ends of the region K decrease.

In the meantime, with reference to FIG. 6, when an over-discharge current intermittently flows in the single cell 110, the salt concentration C near the center of the region K decreases, but the salt concentrations C near both ends of the region K increase.

As such, in the salt concentration unevenness in the overcharge state (FIG. 5) and the salt concentration unevenness (FIG. 6) in the over-discharge state, directions (fluctuation directions) where the salt concentration unevenness occurs at each position in the region K are reverse to each other. Accordingly, in a case of the overcharge state, an over-discharge current in a reverse direction is applied to the secondary battery 100, and in a case of the over-discharge state, an overcharge current in a reverse direction is applied to the secondary battery 100, such that the salt concentration unevenness can be eliminated. That is, by applying a current in a reverse direction to a current that has caused a salt concentration unevenness, high-rate deterioration can be moderated.

In the meantime, in the vehicle 1, charging (external charging) of the secondary battery 100 by the external power supply 250 is performable. In a case where the secondary battery 100 is in the overcharge state due to running or the like before the execution of the external charging, the execution of the external charging in which a charging current flows through the secondary battery 100 might further increase the salt concentration unevenness, which might further promote the high-rate deterioration. In the meantime, in a case where the secondary battery 100 is in the over-discharge state before the execution of the external charging, the execution of the external charging might eliminate the salt concentration unevenness and moderate the high-rate deterioration. However, in a case where the external charging is stopped early and the vehicle 1 is started to run, the running might be started before the high-rate deterioration is moderated by the execution of the external charging.

In view of this, in the battery system 2 according to the present embodiment, in a case where the high-rate deterioration progresses before the execution of the external charging, the external charging is started after the high-rate deterioration is moderated by eliminating the salt concentration unevenness. More specifically, it is determined whether the high-rate deterioration progresses or not based on an internal resistance of the secondary battery 100 before the execution of the external charging, and when it is determined that the high-rate deterioration progresses, it is checked whether the secondary battery 100 is in the overcharge state or in the over-discharge state. In accordance with its check result, a current in a reverse direction to eliminate the salt concentration unevenness is applied to the secondary battery 100 so as to moderate the high-rate deterioration, and then, the external charging is executed.

Here, depending on a state of charge (hereinafter also referred to as an SOC) of the secondary battery 100, even if a current in a reverse direction to a current (an over-discharge current or an overcharge current) that has caused a salt concentration unevenness flows through the secondary battery 100, the salt concentration unevenness might not be eliminated and the salt concentration unevenness might further increase. More specifically, the negative electrode of the secondary battery 100 expands and contracts along with charge and discharge of the secondary battery 100. In terms of this, an expansion-contraction change of the negative electrode along with the charge and discharge varies depending on the SOC, and in an SOC region where the expansion-contraction change is large, such a phenomenon occurs that the electrolytic solution is pushed out from the negative electrode due to expansion and contraction of the negative electrode along with the charge and discharge of the secondary battery 100. As a result, in such an SOC region, even if the current in the reverse direction to the current that has caused the salt concentration unevenness is applied to the secondary battery 100, the salt concentration unevenness further increases, which further promotes high-rate deterioration.

Figure 7:
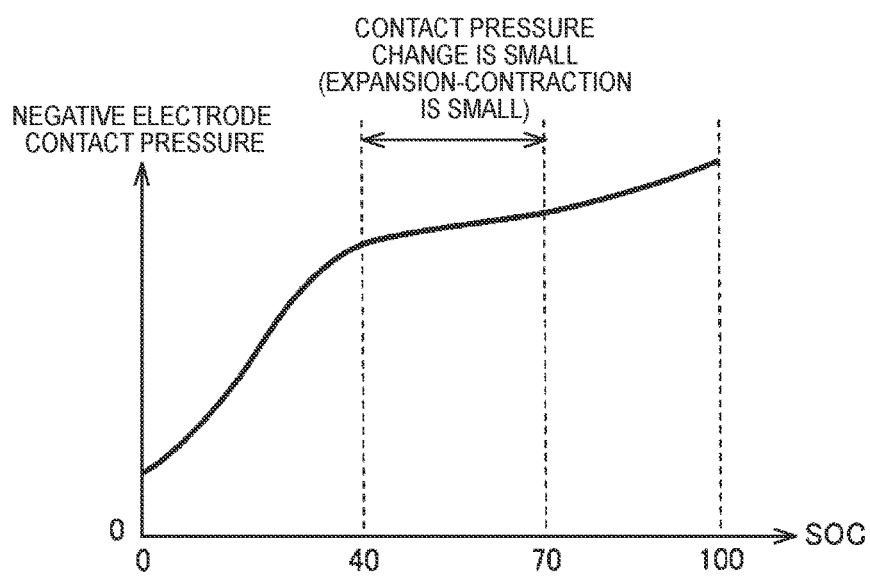
FIG. 7 is a view illustrating a state of charge (hereinafter also referred to as an SOC) dependence of expansion-contraction change of a negative electrode along with charge and discharge of the secondary battery.

FIG. 7 is a view illustrating an SOC dependence of the expansion-contraction change of the negative electrode along with the charge and discharge of the secondary battery 100. In FIG. 7, a horizontal axis indicates the SOC of the secondary battery 100, and a vertical axis indicates a contact pressure of the negative electrode of the secondary battery 100. A negative electrode contact pressure can be used as an index indicative of expansion and contraction of the negative electrode, and a larger negative electrode contact pressure indicates that the negative electrode expands, and a larger change in the contact pressure indicates a larger expansion-contraction change of the negative electrode.

With reference to FIG. 7, when the SOC is low, the negative electrode contact pressure is low, and when the SOC increases, the negative electrode contact pressure increases. Here, when the SOC is low (e.g., when the SOC is lower than 40 percentage (hereinafter also referred to as "%") or when the SOC is high (e.g., when the SOC is higher than 70%), a change of the negative electrode contact pressure with respect to a change of the SOC is large, that is, the expansion-contraction change of the negative electrode along with the charge and discharge of the secondary battery 100 is large. Such an SOC region has the phenomenon in which the electrolytic solution is pushed out from the negative electrode along with the charge and discharge of the secondary battery 100, and even if a current in a reverse direction to a current (an over-discharge current or an overcharge current) that has caused a salt concentration unevenness is applied to the secondary battery 100, high-rate deterioration further progresses.

In the meantime, in a range where the SOC is from 40% to 70%, the change of the negative electrode contact pressure with respect to the change of the SOC is small, that is, the expansion-contraction change of the negative electrode along with the charge and discharge of the secondary battery 100 is small. Such an SOC region hardly has the phenomenon in which the electrolytic solution is pushed out from the negative electrode along with the charge and discharge of the secondary battery 100, and when the current in the reverse direction to the current that has caused the salt concentration unevenness is applied to the secondary battery 100, it is possible to moderate the high-rate deterioration.

In view of this, in the battery system 2 according to the present embodiment, before the execution of the external charging, the SOC is adjusted such that the SOC falls within a range (a range where the SOC is from 40% to 70%) where the expansion-contraction change of the negative electrode along with the charge and discharge of the secondary battery 100 is small, and then, a process of moderating the high-rate deterioration is executed. More specifically, after the charging device 210 and the PCU 200 are driven appropriately such that the SOC is adjusted to fall within the above range, it is checked whether the secondary battery 100 is in the overcharge state or in the over-discharge state, and a current in a reverse direction to eliminate the salt concentration unevenness is applied to the secondary battery 100 based on the check result. Hereby, the external charging can be executed after the high-rate deterioration is surely moderated, and as a result, it is possible to restrain progression of the high-rate deterioration due to the execution of the external charging, in comparison with a state before the execution of the external charging.

Figure 8:
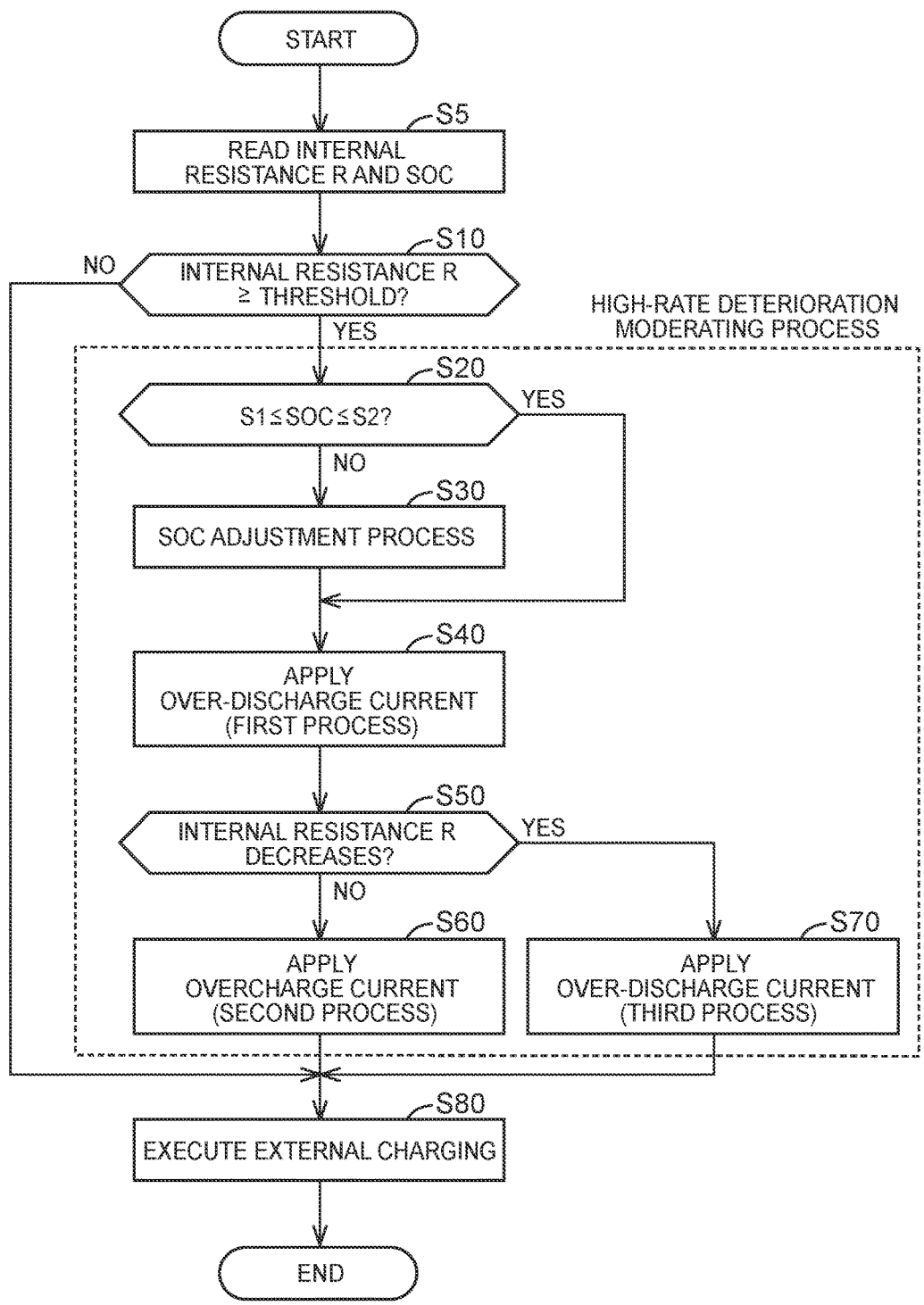
FIG. 8 is a flowchart illustrating a procedure of a high-rate deterioration moderating process performed before execution of external charging to the secondary battery.

FIG. 8 is a flowchart illustrating a procedure of a high-rate deterioration moderating process performed before the execution of the external charging. The process illustrated in the flowchart is started in response to a predetermined trigger (e.g., a connection of the charger cable to the charging device 210, and the like) indicating that the external charging has been requested.

With reference to FIG. 8, the ECU 300 reads an internal resistance R of the secondary battery 100 and a value of the SOC from the memory 302 (step S5). The internal resistance R and the value of the SOC are calculated as required during the running of the vehicle 1, and the internal resistance R and the value of the SOC thus read herein are stored in the memory 302 at the end of previous running. Note that various well-known techniques can be used as calculation methods of the internal resistance R and the SOC.

Subsequently, the ECU 300 determines whether or not the internal resistance R of the secondary battery 100 is a threshold or more (step S10). The threshold is a decision value to determine, based on the internal resistance R of the secondary battery 100, whether high-rate deterioration progresses in the secondary battery 100 or not, and is set appropriately based on a result or the like of a preliminary performance evaluation test of the secondary battery 100. Note that the internal resistance R increases both when the high-rate deterioration progresses toward an over-discharge side and when the high-rate deterioration progresses toward an overcharge side.

In a case where it is determined that the internal resistance R is smaller than the threshold in step S10 (NO in step S10), it is determined that the high-rate deterioration does not progress, and the ECU 300 shifts the process to step S80 and executes the external charging (step S80) without executing the high-rate deterioration moderating process from steps S20 to S70 subsequent to step S10.

In a case where it is determined that the internal resistance R is the threshold or more in step S10 (YES in step S10), it is determined that the high-rate deterioration progresses, and the ECU 300 executes the following process to moderate the high-rate deterioration, before the execution of the external charging in step S80.

That is, the ECU 300 determines whether the SOC of the secondary battery 100 falls within a predetermined range (a range from S1 to S2) or not (step S20). S1 and S2 are values of the SOC for defining a region where the expansion-contraction change of the negative electrode along with the charge and discharge of the secondary battery 100 is small, as illustrated in FIG. 7, and S1 and S2 are 40% and 70%, respectively.

When it is determined that the SOC does not fall within the predetermined range (not less than S1 but not more than S2) (NO in step S20), the ECU 300 executes an SOC adjustment process of adjusting the SOC such that the SOC falls within the predetermined range (step S30). A charging function (in a case of increasing the SOC) of the external power supply 250 or the charging device 210 and a discharge function (in a case of decreasing the SOC) of the PCU 200 can be used for the adjustment of the SOC. Note that, at this stage, the charge and discharge of the secondary battery 100 along with the SOC adjustment might promote the high-rate deterioration, so it is desirable that a magnitude of a charging-discharging current for the SOC adjustment be restrained to such an extent that the high-rate deterioration does not progress.

Note that, when it is determined that the SOC falls within the predetermined range (not less than S1 but not more than S2) in step S20 (YES in step S20), the process is shifted to step S40 without executing the SOC adjustment process in step S30.

Subsequently, the ECU 300 executes a process (a first process) of applying an over-discharge current to the secondary battery 100 (step S40). This process is a process of applying, to the secondary battery 100, a current to check whether the secondary battery 100 is in the over-discharge state or in the overcharge state.

Figure 9:
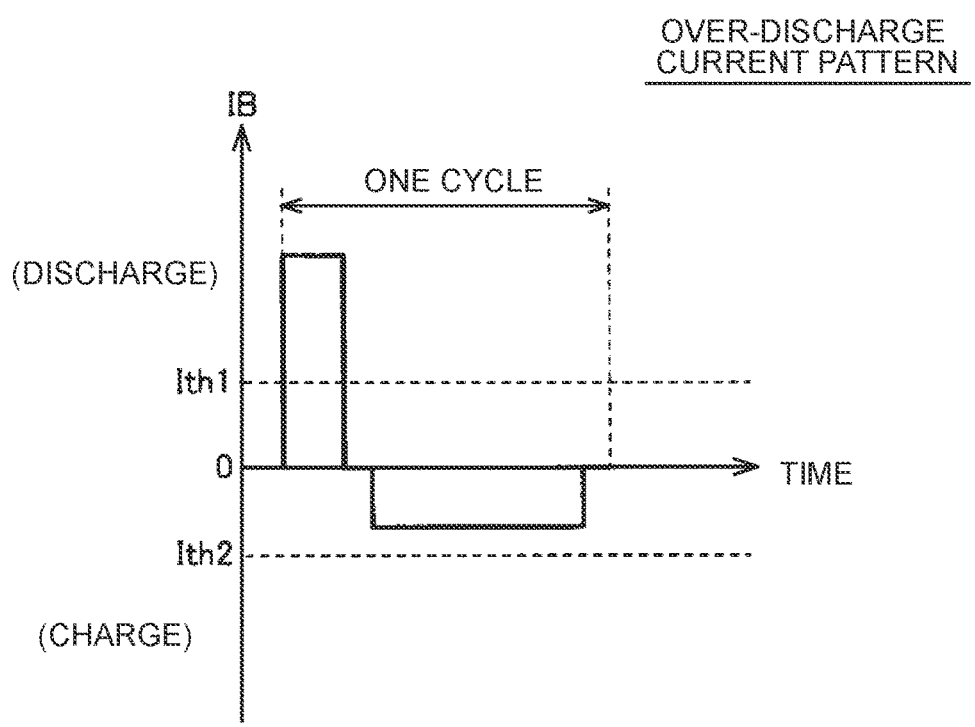
FIG. 9 is a view illustrating one example of a current pattern at the time when an over-discharge current is applied to the secondary battery.

FIG. 9 is a view illustrating one example of a current pattern at the time when the over-discharge current is applied to the secondary battery 100. With reference to FIG. 9, the current pattern is constituted by a first discharging current pulse and a first charging current pulse having the same quantity of electricity. A magnitude of the first discharging current pulse is larger than a first threshold Ith1. A magnitude of the first charging current pulse is smaller than a second threshold Ith2. The thresholds Ith1, Ith2 are values set such that an influence on a salt concentration unevenness becomes large when a magnitude of the current IB exceeds these values, and are set appropriately based on a result or the like of a preliminary performance evaluation test of the secondary battery 100.

With such a current pattern, it is possible to apply an over-discharge current to the secondary battery 100 and to maintain the SOC of the secondary battery 100 before or after the current pattern is applied thereto. In step S40, the ECU 300 executes a process of applying the over-discharge current to the secondary battery 100, the over-discharge current including at least one set of such a current pattern. As one example, the current pattern illustrated in FIG. 9 is assumed one cycle, and about 10 cycles of the current pattern is applied to the secondary battery 100.

Note that the ECU 300 can generate the first discharging current pulse by driving the PCU 200 such that a current flows from the secondary battery 100 to the PCU 200. Further, the ECU 300 can generate the first charging current pulse by driving the charging device 210 such that a current flows from the external power supply 250 to the secondary battery 100 via the charging device 210.

Referring to FIG. 8 again, the ECU 300 determines whether the internal resistance R of the secondary battery 100 is decreased by the execution of the first process in step S40 or not (step S50). When it is determined that the internal resistance R is not decreased, that is, the internal resistance R is increased (NO in step S50), the ECU 300 executes a process (a second process) of applying an overcharge current to the secondary battery 100 (step S60). Since the internal resistance R is increased by applying the over-discharge current to the secondary battery 100 in step S40, it is determined that the secondary battery 100 is in the over-discharge state, and therefore, by applying, to the secondary battery 100, an overcharge current in a reverse direction to the over-discharge current of the first process, a salt concentration unevenness is eliminated such that high-rate deterioration is moderated.

Figure 10:
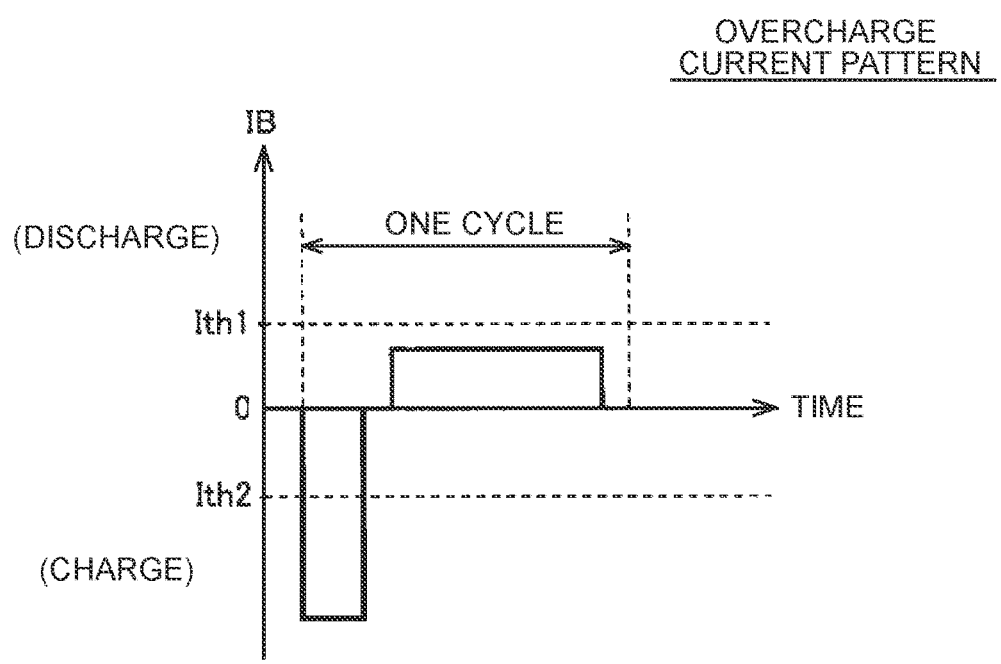
FIG. 10 is a view illustrating one example of a current pattern at the time when an overcharge current is applied to the secondary battery.

FIG. 10 is a view illustrating one example of a current pattern at the time when the overcharge current is applied to the secondary battery 100. With reference to FIG. 10, the current pattern is constituted by a second charging current pulse and a second discharging current pulse having the same quantity of electricity. A magnitude of the second charging current pulse is larger than the second threshold Ith2. A magnitude of the second discharging current pulse is smaller than the first threshold Ith1. As described in FIG. 9, the thresholds Ith1, Ith2 are values set such that the influence on the salt concentration unevenness becomes large when the magnitude of the current IB exceeds these values.

With such a current pattern, it is possible to apply the overcharge current to the secondary battery 100 and to maintain the SOC of the secondary battery 100 before or after the current pattern is applied thereto. Then, in step S60, the ECU 300 executes a process of applying the overcharge current to the secondary battery 100, the overcharge current including at least one set of such a current pattern. As one example, the current pattern illustrated in FIG. 10 is assumed one cycle, and about 20 cycles of the current pattern is applied to the secondary battery 100. However, the number of cycles of the current pattern may be changed appropriately depending on a decrease degree of the internal resistance R (a moderation degree of the high-rate deterioration).

Note that the ECU 300 can generate the second charging current pulse by driving the charging device 210 such that a current flows from the external power supply 250 to the secondary battery 100 via the charging device 210. Further, the ECU 300 can generate the second discharging current pulse by driving the PCU 200 such that a current flows from the secondary battery 100 to the PCU 200.

Referring to FIG. 8 again, when it is determined that the internal resistance R is decreased in step S50 (YES in step S50), the ECU 300 executes a process (a third process) of applying an over-discharge current to the secondary battery 100 (step S70). Since the internal resistance R is decreased by applying the over-discharge current to the secondary battery 100 in step S40, it is determined that the secondary battery 100 is in the overcharge state, and therefore, by applying, to the secondary battery 100, an over-discharge current in the same direction as the over-discharge current of the first process, the salt concentration unevenness is eliminated such that the high-rate deterioration is moderated.

Even in step S70, an over-discharge current is applied to the secondary battery 100, the over-discharge current including at least one set of the current pattern illustrated in FIG. 9. As one example, in step S70, in order to moderate the high-rate deterioration of the secondary battery 100, the current pattern illustrated in FIG. 9 is assumed one cycle, and about 20 cycles of the current pattern is applied to the secondary battery 100. However, the number of cycles of the current pattern may be changed appropriately depending on a decrease degree of the internal resistance R (a moderation degree of the high-rate deterioration).

After the high-rate deterioration of the secondary battery 100 is moderated by the execution of step S60 or S70, the ECU 300 drives the charging device 210 and executes the external charging to charge the secondary battery 100 by the external power supply 250 (step S80).

Figure 11:
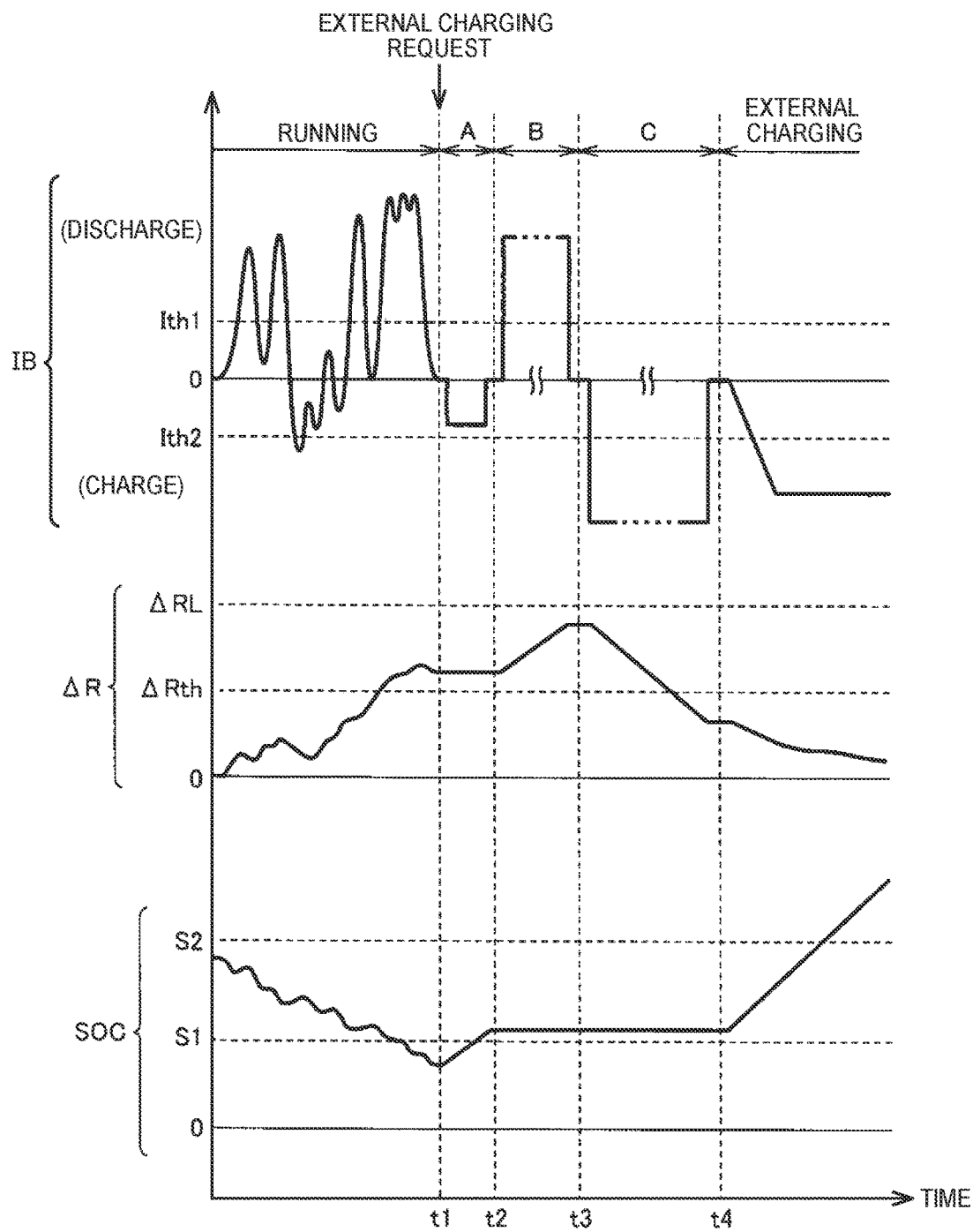
FIG. 11 is a view illustrating one example of a state where external charging is executed after high-rate deterioration is moderated by the high-rate deterioration moderating process illustrated in FIG. 8.

FIG. 11 is a view illustrating one example of a state where the external charging is executed after the high-rate deterioration is moderated by the high-rate deterioration moderating process illustrated in FIG. 8. In FIG. 11, ΔR indicates an increasing amount of the internal resistance R of the secondary battery 100 from a reference value (e.g., a value just after the manufacture).

Referring now to FIG. 11, the vehicle 1 runs before a time t1, and the vehicle 1 reaches a battery charging point (a home and the like) where the external charging is performable, at the time t1. During the running of the vehicle 1, the current IB (a discharging current) more than the threshold Ith1 at which an influence on a salt concentration unevenness on an over-discharge side is large flows intermittently, such that the internal resistance R also increases along with that. When the vehicle 1 reaches the battery charging point (a home and the like) where the external charging is performable, at the time t1, the charger cable is connected to the charging device 210 of the vehicle 1, such that the external charging is requested.

When the external charging is requested, it is determined whether or not the internal resistance R of the secondary battery 100 is the threshold or more (step S10 in FIG. 8). In the example illustrated in FIG. 11, it is determined that the internal resistance R is the threshold or more, because the increasing amount ΔR of the internal resistance R is a threshold ΔRth or more, and thus, it is determined that high-rate deterioration of the secondary battery 100 progresses. Note that when the increasing amount ΔR of the internal resistance R reaches the threshold ΔRL, input and output of the secondary battery 100 is limited forcibly.

When it is determined that the high-rate deterioration progresses, the process of moderating the high-rate deterioration is executed before the execution of the external charging. That is, it is first determined whether the SOC of the secondary battery 100 falls within the predetermined range (not less than S1 but not more than S2) or not. In this example, since the SOC is lower than S1 (out of the predetermined range), the SOC adjustment process (step S30 of FIG. 8) is executed. Note that, in the SOC adjustment process, a charging current is supplied to the secondary battery 100 by use of the charging device 210 so as to increase the SOC to the predetermined range, but at this point of time, it is uncertain whether the secondary battery 100 is in the over-discharge state or in the overcharge state. Accordingly, the current IB is adjusted so as not to exceed the threshold Ith2 at which an influence on a salt concentration unevenness becomes large.

When the SOC falls within the predetermined range (not less than S1 but not more than S2) by the SOC adjustment process and the SOC adjustment process is finished at a time t2, an over-discharge current is applied to the secondary battery 100 (step S40 in FIG. 8) so as to check whether the secondary battery 100 is in the over-discharge state or in the overcharge state. Note that, in FIG. 11, only a current on a discharge side is illustrated to facilitate understanding from the time t2 to a time t3 during which the over-discharge current is applied to the secondary battery 100, but 10 cycles of the over-discharge current pattern illustrated in FIG. 9 are actually applied. Note that, by applying the over-discharge current pattern illustrated in FIG. 9, a degree of the high-rate deterioration is changed, but the SOC does not change in total.

In the example illustrated in FIG. 11, the over-discharge current is applied to the secondary battery 100, such that the internal resistance R increases (an internal resistance increasing amount ΔR increases from the time t2 to the time t3). Accordingly, it is determined that the secondary battery 100 is in the over-discharge state. In view of this, in order to moderate high-rate deterioration due to the over-discharge state, an overcharge current is applied to the secondary battery 100 after the time t3 (step S50 in FIG. 8). Note that, in FIG. 11, only a current on a charge side is illustrated to facilitate understanding from the time t3 to a time t4 during which the overcharge current is applied to the secondary battery 100, but 20 cycles of the overcharge current pattern illustrated in FIG. 10 are actually applied, for example. When the overcharge current is applied to the secondary battery 100, the internal resistance R decreases (the internal resistance increasing amount ΔR decreases from the time t3 to the time t4). That is, the high-rate deterioration of the secondary battery 100 is moderated. Note that, by applying the overcharge current pattern illustrated in FIG. 10, the high-rate deterioration is moderated, but the SOC does not change.

When the application of the overcharge current to the secondary battery 100 is finished and the high-rate deterioration moderating process is finished at the time t4, external charging of the secondary battery 100 by the external power supply 250 is executed (step S80 in FIG. 8). Note that, in the example illustrated in FIG. 11, the high-rate deterioration in the over-discharge state is further moderated by the execution of the external charging, and the internal resistance R further decreases.

As described above, in the present embodiment, the high-rate deterioration moderating process (the process from the first process to the third process in FIG. 8) is executed after the SOC is adjusted such that the SOC falls within a range (a range from S1 to S2) where the expansion-contraction change of the negative electrode along with the charge and discharge of the secondary battery 100 is small. Hereby, it is possible to check whether the high-rate deterioration is caused by over-discharge or by overcharge, by the execution of the first process (step S40 of FIG. 8), and the high-rate deterioration is surely moderated by the second or third process (step S60 or S70 in FIG. 8) based on the check result. Accordingly, with the present embodiment, it is possible to execute the external charging after the high-rate deterioration is moderated, and as a result, it is possible to restrain progression of the high-rate deterioration due to the execution of the external charging, in comparison with a state before the execution of the external charging.

Next will be described a first modification of the present embodiment. In the above embodiment, when the SOC adjustment process is finished, the over-discharge current is applied to the secondary battery 100 (step S40 in FIG. 8) so as to check whether the secondary battery 100 is in the over-discharge state or in the overcharge state. However, the overcharge current may be applied instead of the over-discharge current.

Figure 12:
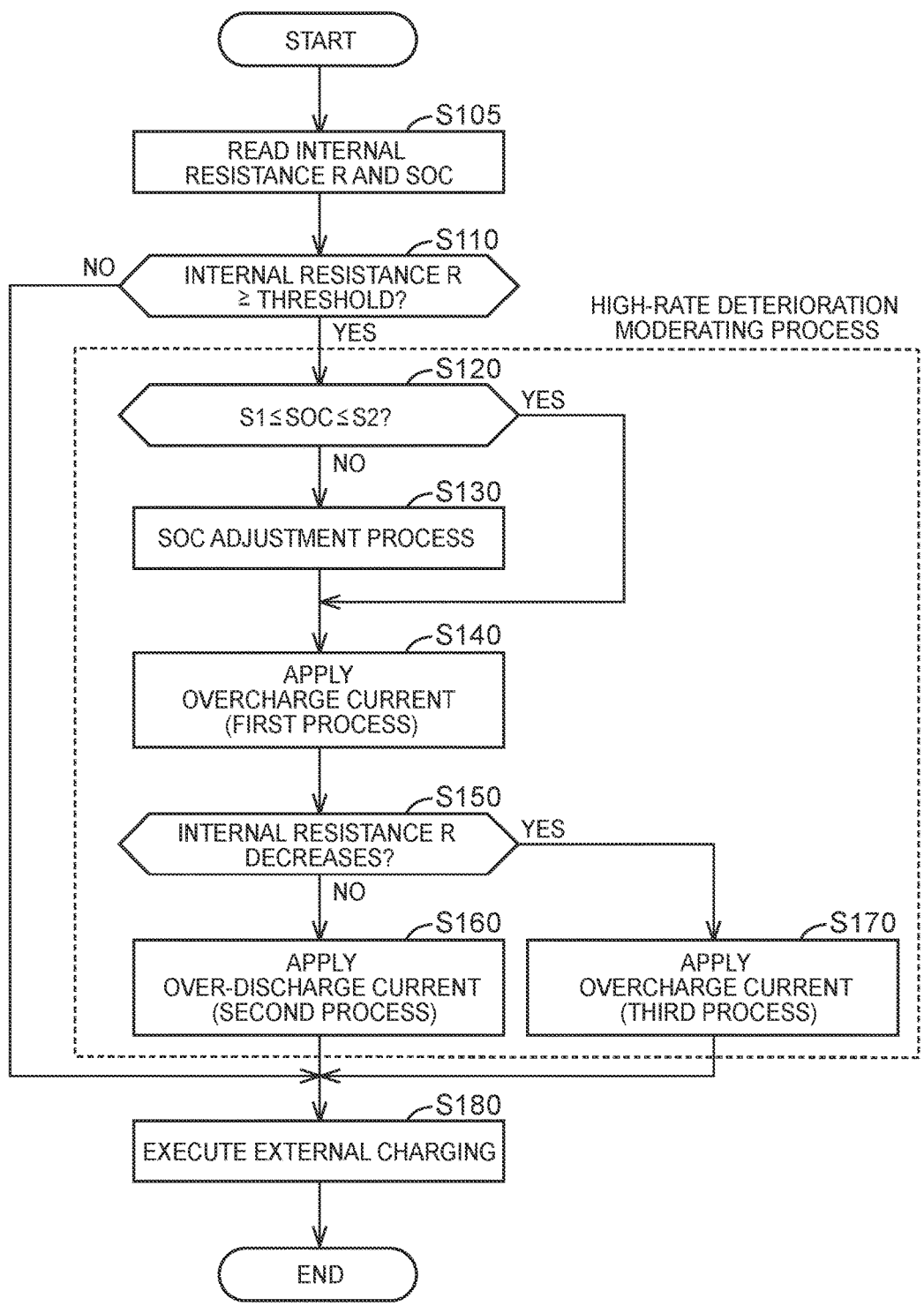
FIG. 12 is a flowchart illustrating a procedure of a high-rate deterioration moderating process performed before execution of external charging, in a first modification of the embodiment of the present disclosure.

FIG. 12 is a flowchart illustrating a procedure of a high-rate deterioration moderating process performed before execution of external charging, in the first modification. The process illustrated in the flowchart is also started in response to a predetermined trigger, e.g., a connection of the charger cable to the charging device 210, indicating that the external charging has been requested.

Referring now to FIG. 12, processes executed in steps S105 to S130, S150, S180 are the same as the processes executed in steps S5 to S30, S50, S80 illustrated in FIG. 8, respectively. In the first modification, when the SOC adjustment process is executed in step S130 or it is determined that the SOC falls within the predetermined range (not less than S1 but not more than S2) in step S120, the ECU 300 executes a process (a first process) of applying an overcharge current to the secondary battery 100 (step S140). This process is also a process of applying, to the secondary battery 100, a current to check whether the secondary battery 100 is in the over-discharge state or in the overcharge state, similarly to step S40 in FIG. 8. More specifically, the ECU 300 executes a process of applying an overcharge current to the secondary battery 100, the overcharge current including at least one set of the current pattern illustrated in FIG. 10. As one example, the current pattern illustrated in FIG. 10 is assumed one cycle, and about 10 cycles of the current pattern is applied to the secondary battery 100.

Then, when it is determined that the internal resistance R of the secondary battery 100 is not decreased, that is, the internal resistance R is increased by the execution of the first process in step S140 (NO in step S150), the ECU 300 executes a process (a second process) of applying an over-discharge current to the secondary battery 100 (step S160). Since the internal resistance R is increased by applying the overcharge current to the secondary battery 100 in step S140, it is determined that the secondary battery 100 is in the overcharge state, and therefore, by applying, to the secondary battery 100, an over-discharge current in a reverse direction to the overcharge current of the first process, a salt concentration unevenness is eliminated and high-rate deterioration is moderated.

In step S160, an over-discharge current is applied to the secondary battery 100, the over-discharge current including at least one set of the current pattern illustrated in FIG. 9. As one example, in step S160, in order to moderate the high-rate deterioration of the secondary battery 100, the current pattern illustrated in FIG. 9 is assumed one cycle, and about 20 cycles of the current pattern is applied to the secondary battery 100. However, the number of cycles of the current pattern may be changed appropriately depending on a decrease degree of the internal resistance R (a moderation degree of the high-rate deterioration).

In the meantime, when it is determined that the internal resistance R is decreased in step S150 (YES in step S150), the ECU 300 executes a process (a third process) of applying an overcharge current to the secondary battery 100 (step S170). Since the internal resistance R is decreased by applying the overcharge current to the secondary battery 100 in step S140, it is determined that the secondary battery 100 is in the over-discharge state, and therefore, by applying, to the secondary battery 100, an overcharge current in the same direction as the overcharge current of the first process, the salt concentration unevenness is eliminated and the high-rate deterioration is moderated.

Note that, even in step S170, the overcharge current is applied to the secondary battery 100, the overcharge current including at least one set of the current pattern illustrated in FIG. 10. As one example, in step S170, in order to moderate the high-rate deterioration of the secondary battery 100, the current pattern illustrated in FIG. 10 is assumed one cycle, and about 20 cycles of the current pattern is applied to the secondary battery 100. However, the number of cycles of the current pattern may be changed appropriately depending on a decrease degree of the internal resistance R (a moderation degree of the high-rate deterioration).

As described above, the first modification also yields the same effect as the above embodiment. Next will be described a second modification of the present embodiment. In the above embodiment and the first modification, the high-rate deterioration is evaluated based on the internal resistance R of the secondary battery 100, but in the second modification, the high-rate deterioration may be evaluated based on other evaluation values.

For example, an increase in a salt concentration unevenness in accordance with a current IB, a temperature TB, an SOC, and the like, and moderation of the salt concentration unevenness by ionic diffusion may be simulated to be expressed as increase terms and decrease terms of an evaluation value D, and a well-known integrated evaluation value $\Sigma D$, which is obtained by integrating the evaluation value D, may be used as an evaluation value for the high-rate deterioration (e.g., see International Publication No. 2013/046243, and so on).

Figure 13:
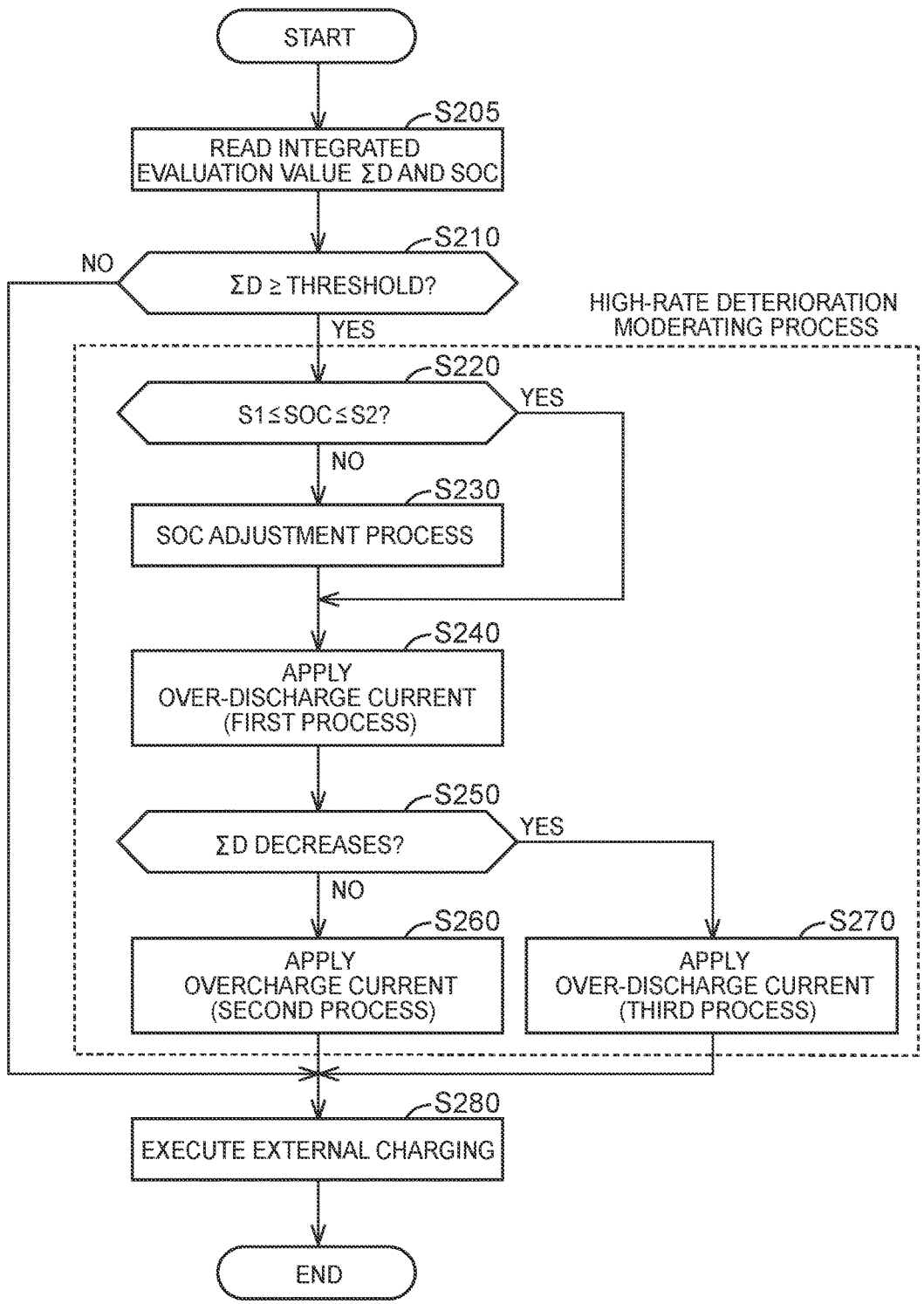
FIG. 13 is a flowchart illustrating a procedure of a high-rate deterioration moderating process performed before execution of external charging, in a second modification of the embodiment of the present disclosure.

FIG. 13 is a flowchart illustrating a procedure of a high-rate deterioration moderating process performed before execution of external charging, in the second modification. The process illustrated in the flowchart is also started in response to a predetermined trigger, e.g., a connection of the charger cable to the charging device 210, indicating that the external charging has been requested.

Referring now to FIG. 13, the ECU 300 reads an integrated evaluation value $\Sigma D$ indicative a degree of high-rate deterioration of the secondary battery 100 and a value of an SOC from the memory 302 (step S205). The integrated evaluation value ED and the value of the SOC are calculated as required during running of the vehicle 1, and the integrated evaluation value $\Sigma D$ and the value of the SOC thus read herein are values stored in the memory 302 at the end of previous running. Note that various well-known techniques can be used as a calculation method of the integrated evaluation value $\Sigma D$.

Subsequently, the ECU 300 determines whether or not the integrated evaluation value $\Sigma D$ is a threshold or more (step S210). The threshold is a decision value to determine, based on the integrated evaluation value $\Sigma D$, whether the high-rate deterioration progresses in the secondary battery 100 or not, and is set appropriately based on a result or the like of a preliminary performance evaluation test of the secondary battery 100.

When it is determined that the integrated evaluation value $\Sigma D$ is smaller than the threshold in step S210 (NO in step S210), it is determined that the high-rate deterioration does not progress, and the ECU 300 shifts the process to step S280 and executes the external charging (step S280) without executing a high-rate deterioration moderating process from steps S220 to S270 subsequent to step S210.

When it is determined that the integrated evaluation value $\Sigma D$ is the threshold or more in step S210 (YES in step S210), it is determined that the high-rate deterioration progresses, and the ECU 300 executes a process of moderating the high-rate deterioration, before the execution of the external charging in step S280.

The processes executed in steps S220 to S240 are the same as the processes executed in steps S20 to S40 illustrated in FIG. 8, respectively.

When an over-discharge current is applied to the secondary battery 100 in step S240 (a first process), the ECU 300 determines whether or not the integrated evaluation value $\Sigma D$ of the secondary battery 100 is decreased by the execution of the first process (step S250). When it is determined that the integrated evaluation value $\Sigma D$ is not decreased, that is, the integrated evaluation value $\Sigma D$ is increased (NO in step S250), the ECU 300 shifts the process to step S260. In the meantime, when it is determined that the integrated evaluation value ED is decreased in step S250 (YES in step S250), the ECU 300 shifts the process to step S270. The processes executed in steps S260, S270, and step S280 subsequent thereto are the same as the processes executed in steps S60 to S80 illustrated in FIG. 8, respectively.

As described above, the second modification also yields the same effect as the above embodiment. Note that, although not illustrated in the figure, similarly to the first modification of the above embodiment, in the second modification, an overcharge current may be applied instead of the over-discharge current in step S240 (the first process). In this case, similarly to the first modification, the overcharge current is applied instead of the over-discharge current in step S260 (the second process), and the overcharge current is applied instead of the over-discharge current in step S270 (the third process).

It should be considered that the embodiment of the present disclosure is just one example in all respects and is not limitative. A scope of the present disclosure is shown by Claims, not by the descriptions of the above embodiment, and is intended to include every modification made within the meaning and scope equivalent to Claims.

What is claimed is:

1. A battery system for a vehicle, comprising:
   a secondary battery provided in the vehicle;

a charging device configured to charge the secondary battery by a power supply provided outside the vehicle; and an electronic control unit configured to:
(i) control charge and discharge of the secondary battery;
(ii) execute a state of charge adjustment process of adjusting a state of charge of the secondary battery such that the state of charge falls within a predetermined range, the state of charge adjustment process being executed when deterioration of the secondary battery progresses before the secondary battery is charged by the charging device, the deterioration of the secondary battery being deterioration in which an internal resistance of the secondary battery increases along with a deviation of a salt concentration distribution in the secondary battery due to the charge and discharge of the secondary battery, the predetermined range being a range where an expansion-contraction change of a negative electrode of the secondary battery along with the charge and discharge of the secondary battery is small as compared with a case where the state of charge is out of the predetermined range;
(iii) execute a first process of controlling the charge and discharge of the secondary battery, after executing the state of charge adjustment process, such that either one of an over-discharge current, an absolute value of which is larger than a first threshold, and an overcharge current, an absolute value of which is larger than a second threshold, flows through the secondary battery;
(iv) execute a second process of controlling the charge and discharge of the secondary battery such that a different one of the over-discharge current and the overcharge current from the first process flows through the secondary battery, when the deterioration further progresses due to execution of the first process;
(v) execute a third process of controlling the charge and discharge of the secondary battery such that the same current as the one flowing in the first process, out of the over-discharge current and the overcharge current, flows through the secondary battery, when the deterioration is moderated by the execution of the first process; and
(vi) charge the secondary battery by the charging device, after the execution of the second or third process.

2. The battery system for the vehicle, according to claim 1, wherein
the electronic control unit is configured to:
(i) execute the second process based on determination that the deterioration further progresses by the execution of the first process, when the internal resistance of the secondary battery is increased by the execution of the first process; and
(ii) execute the third process based on determination that the deterioration is moderated by the execution of the first process, when the internal resistance of the secondary battery is decreased by the execution of the first process.

3. The battery system for the vehicle, according to claim 1, wherein a lower limit of the predetermined range is a state of charge of 40 percentage or more, and an upper limit of the predetermined range is a state of charge of 70 percentage or less.

4. The battery system for the vehicle, according to claim 1, wherein
(i) the over-discharge current includes at least one set of a current pattern constituted by a first discharging current pulse and a first charging current pulse having the same quantity of electricity;
(ii) the overcharge current includes at least one set of a current pattern constituted by a second charging current pulse and a second discharging current pulse having the same quantity of electricity; and
(iii) an absolute value of the first discharging current pulse is larger than the first threshold, an absolute value of the first charging current pulse is smaller than the second threshold, an absolute value of the second charging current pulse is larger than the second threshold, and an absolute value of the second discharging current pulse is smaller than the first threshold.

5. A control method of a battery system for a vehicle, the battery system including a secondary battery provided in the vehicle, and a charging device configured to charge the secondary battery by a power supply provided outside the vehicle, the control method comprising:
(i) executing a state of charge adjustment process of adjusting a state of charge of the secondary battery such that the state of charge falls within a predetermined range, the state of charge adjustment process being executed when deterioration of the secondary battery progresses, before the secondary battery is charged by the charging device, the deterioration of the secondary battery being deterioration in which an internal resistance of the secondary battery increases along with a deviation of a salt concentration distribution in the secondary battery due to charge and discharge of the secondary battery, the predetermined range being a range where an expansion-contraction change of a negative electrode of the secondary battery along with the charge and discharge of the secondary battery is small as compared with a case where the state of charge is out of the predetermined range;
(ii) executing a first process of controlling the charge and discharge of the secondary battery, after executing the state of charge adjustment process, such that either one of an over-discharge current, an absolute value of which is larger than a first threshold, and an overcharge current, an absolute value of which is larger than a second threshold, flows through the secondary battery;
(iii) executing a second process of controlling the charge and discharge of the secondary battery such that a different one of the over-discharge current and the overcharge current from the first process flows through the secondary battery, when the deterioration further progresses due to execution of the first process;
(iv) executing a third process of controlling the charge and discharge of the secondary battery such that the same current as the one flowing in the first process, out of the over-discharge current and the overcharge current, flows through the secondary battery, when the deterioration is moderated by the execution of the first process; and
(v) charging the secondary battery by the charging device after the execution of the second or third process.

* * * * *